(12) United States Patent
Cheng

(10) Patent No.: US 9,748,221 B2
(45) Date of Patent: Aug. 29, 2017

(54) ELECTROSTATIC DISCHARGE PROTECTION DEVICE AND MANUFACTURING METHOD THEREOF

(71) Applicant: Fitipower Integrated Technology, Inc., Hsinchu (TW)

(72) Inventor: Chih-Nan Cheng, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 0 days.

(21) Appl. No.: 14/456,041

(22) Filed: Aug. 11, 2014

(65) Prior Publication Data
US 2015/0041920 A1 Feb. 12, 2015

(30) Foreign Application Priority Data
Aug. 9, 2013 (TW) .............................. 102128554 A

(51) Int. Cl.
| | |
|---|---|
| H01L 27/02 | (2006.01) |
| H01L 29/66 | (2006.01) |
| H01L 29/78 | (2006.01) |
| H01L 29/06 | (2006.01) |
| H01L 21/265 | (2006.01) |
| H01L 29/423 | (2006.01) |
| H01L 29/08 | (2006.01) |

(52) U.S. Cl.
CPC ...... *H01L 27/0266* (2013.01); *H01L 29/0626* (2013.01); *H01L 29/66681* (2013.01); *H01L 29/7818* (2013.01); *H01L 21/26513* (2013.01); *H01L 29/0653* (2013.01); *H01L 29/0878* (2013.01); *H01L 29/42368* (2013.01)

(58) Field of Classification Search
CPC . H01L 27/0266; H01L 29/74; H01L 27/0248; H01L 27/0262
See application file for complete search history.

(56) References Cited

U.S. PATENT DOCUMENTS

| | | | |
|---|---|---|---|
| 6,469,354 B1 * | 10/2002 | Hirata ................. | H01L 27/0266 257/358 |
| 6,586,806 B1 * | 7/2003 | Pai ...................... | H01L 21/2652 257/389 |
| 2005/0253174 A1 | 11/2005 | Sakuragi et al. | |
| 2010/0128401 A1 * | 5/2010 | Lai ...................... | H01L 27/0266 361/56 |
| 2013/0222953 A1 * | 8/2013 | Unterleitner ........ | H01L 27/0266 361/56 |

FOREIGN PATENT DOCUMENTS

| | | |
|---|---|---|
| CN | 1144288 | 3/2004 |
| CN | 1694264 | 11/2005 |
| TW | 201021188 | 6/2010 |
| WO | 2011058114 | 5/2011 |

* cited by examiner

*Primary Examiner* — Marc Armand
*Assistant Examiner* — Quinton Brasfield
(74) *Attorney, Agent, or Firm* — Steven Reiss

(57) ABSTRACT

An electrostatic discharge (ESD) protection device includes two N-metal oxide semiconductor (NMOS) elements and a doped region. The two NMOS elements are arranged on a P-substrate, and each NMOS element includes a gate, a source, and a drain. The source and the drain are arranged on two opposite sides of the gate. The doped region is implanted into an outer space of the two NMOS surrounding the two NMOS, and a PN junction is formed by the doped region and the P-substrate.

19 Claims, 4 Drawing Sheets

ELECTROSTATIC DISCHARGE PROTECTION DEVICE AND MANUFACTURING METHOD THEREOF

CROSS-REFERENCE TO RELATED APPLICATIONS

This application claims priority to Taiwanese Patent Application No. 102128554 filed on Aug. 9, 2013 in the Taiwan Intellectual Property Office, the contents of which are incorporated by reference herein.

FIELD

The disclosure generally relates to an electrostatic discharge (ESD) protection device and a manufacturing method thereof.

BACKGROUND

A protection ability of an ESD protection device is an important characteristic parameter of an integrated circuit (IC). The ESD protection device may increase complexity, dimension, and cost of the IC.

BRIEF DESCRIPTION OF THE DRAWINGS

Implementations of the present technology will now be described, by way of example only, with reference to the attached figures, wherein.

DETAILED DESCRIPTION

Figure 1:
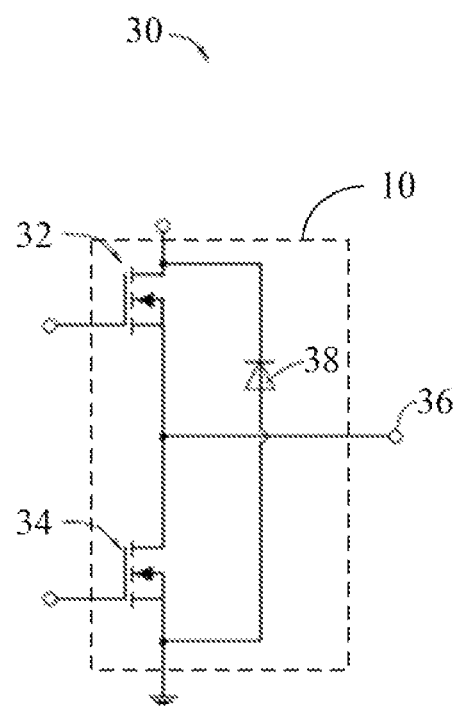
FIG. 1 is a circuit diagram of an output terminal of a DC-DC converter including an electrostatic discharge (ESD) protection device according to an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Referring to FIG. 1, a DC-DC converter 30 can include a high-side switch 32, a low-side switch 34, an output terminal 36, and a diode 38. The high-side switch 32 and the low-side switch 34 alternately turn on under a control signal. In the embodiment, the high-side switch 32 and the low-side switch 34 are N-metal oxide semiconductor (NMOS) elements. The high-side switch 32, the low-side switch 34, and the diode 38 are formed on a substrate to form an electrostatic discharge (ESD) protection device 10. In the embodiment, the diode 38 can be a junction between the substrate and a doped region.

Figure 2:
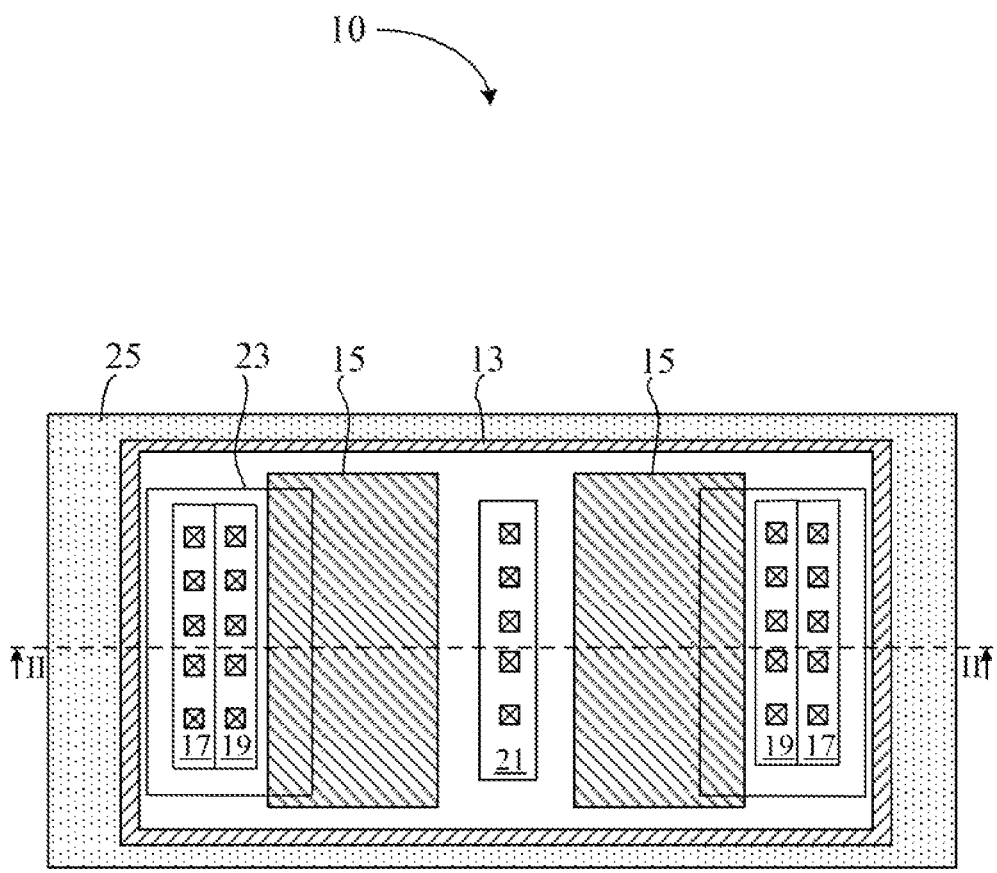
FIG. 2 is a plan view of the ESD protection device of FIG. 1.
Figure 3:
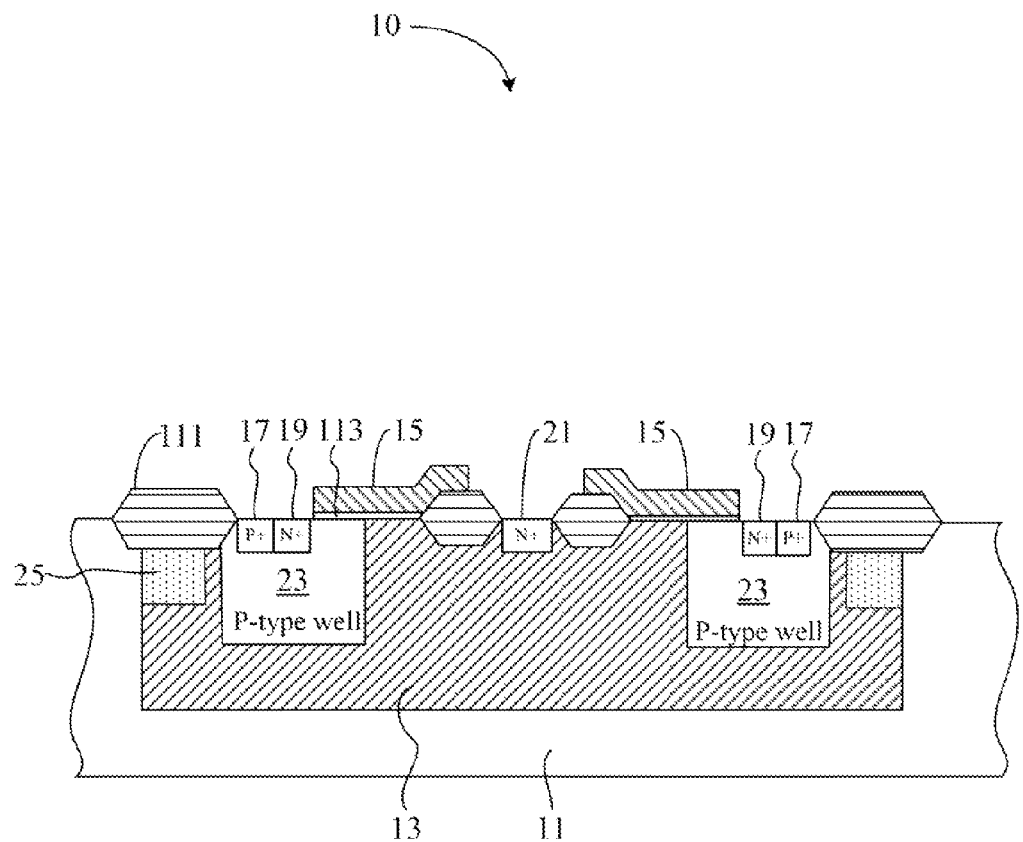
FIG. 3 is a cross-sectional view of the ESD protection device of FIG. 2 along line II-II.

Referring to FIGS. 2 and 3, the ESD protection device 10 can include at least two NMOS elements. In the embodiment, the two NMOS elements are the high-side switch 32 and the low-side switch 34. A structure of the high-side switch 32 is similar to the low-side switch 34, and the high-side switch 32 is depicted.

The high-side switch 32 is arranged on an N-type well 13 of a P-substrate 11. The high-side switch 32 can include a gate 15. One part of the gate 15 covers an isolation layer 111, and the other part of the gate 15 covers a high voltage gate oxide layer 113. The isolation layer 111 is made by a field oxide process. A P+ doping region 17 and a first N+ doping region 19 connected to the P+ doping region 17 are arranged on one side of the gate 15, and a second N+ doping region 21 is arranged on the other side of the gate 15. In the embodiment, the first N+ doping region 19 serves as a source of the high-side switch 32, the second N+ doping region 21 serves as a drain of the high-side switch 32. The P+ doping region 17 and the first N+ doping region 19 are arranged in the P-type well 23. The P-type well 23 is arranged in an N-type well 13 of the P-substrate 11.

The high-side switch 32 can further include a doped region 25. The doped region 25 is formed surrounding the P-type well 23. In the embodiment, the doped region 25 is implanted to the N-type well 13 by an ion implantation process using energy of about 80-150 KeV. The doped region 25 can include highly N-type impurities, such as phosphor, arsenic, and antimony. The doped region 25 has heavier N-type impurity concentration than the N-type well 13. In the embodiment, a density of the N-type impurities is larger than 8.5E12 atom/cm$^2$.

The PN junction is formed by the doped region 25 and the P-substrate 11. The PN junction can be the diode 38. The PN junction provides a lower junction breakdown voltage than a breakdown voltage of the high voltage gate oxide layer 113.

Thus, the PN junction can discharge electrostatic in time to improve the ESD protection ability of the DC-DC converter 30. Further, an additional ESD protection device can be omitted, thus the dimension of the IC can be reduced.

Figure 4:
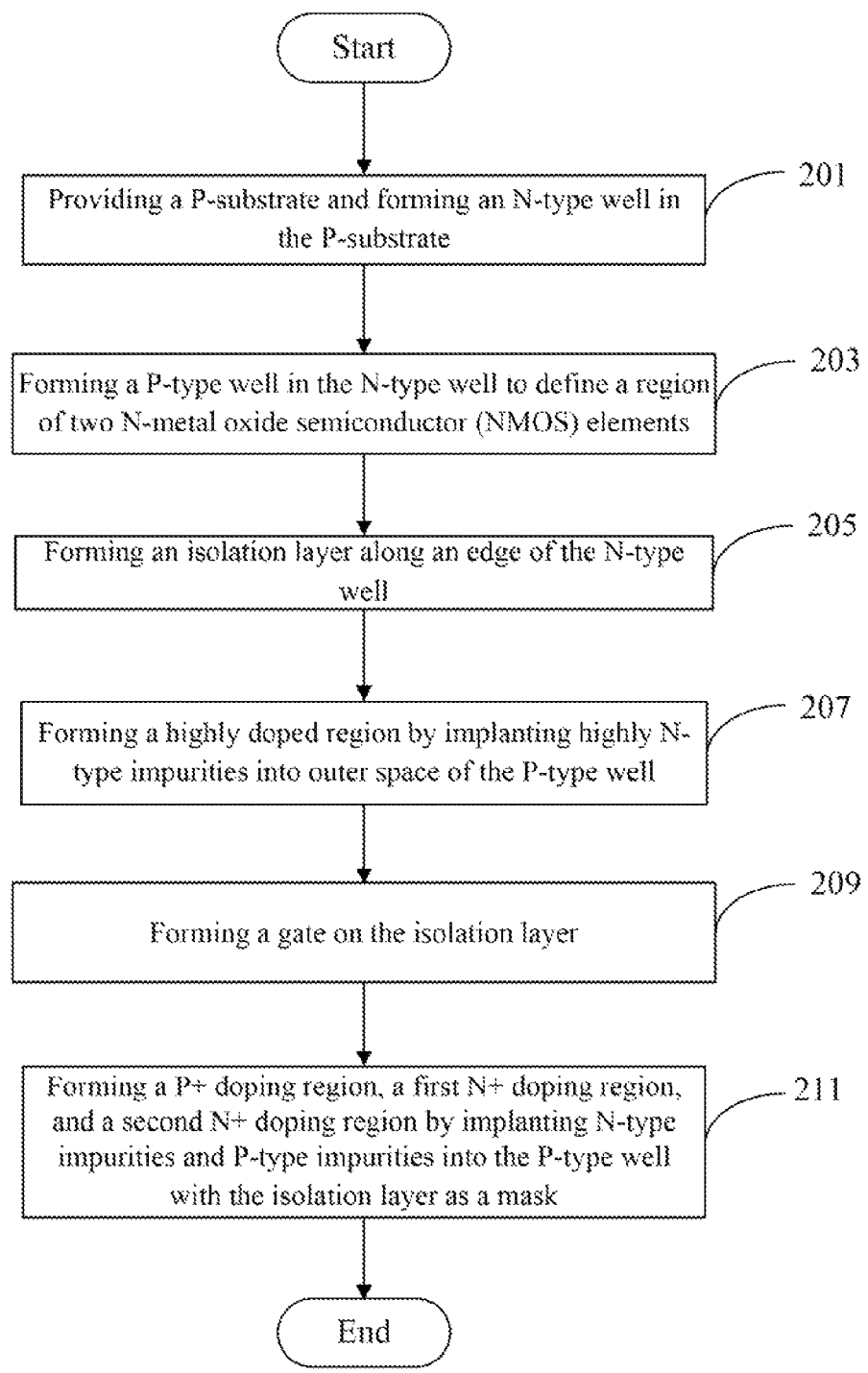
FIG. 4 is a flowchart of a manufacturing method of the ESD protection device of FIG. 2.

FIG. 4 shows a flowchart of the manufacturing method of the ESD protection device 20.

At block 201, a P-substrate is provided, and an N-type well is formed in the P-substrate.

At block 203, a P-type well is formed in the N-type well to define a region of a high-side switch and a low-side switch.

At block 205, the isolation layer is formed along an edge of the N-type well.

At block 207, highly N-type impurities are implanted into outer space of the first N+ doping region to form the doped region. In the embodiment, the doped region surrounds around the P-type well.

At block 209, the gate is formed on the isolation layer. In the embodiment, the gate 15 is formed by, for example but not limited to, thin film deposition.

At block 211, the isolation layer is used as a mask, and N-type impurities and P-type impurities are implanted into the P-type well to form the P+ doping region, the first N+ doping region, and the second N+ doping region. In the embodiment, the first N+ doping region servers as the source of the NMOS element, the second N+ doping region servers as the drain of the NMOS element. In the embodiment, the N-type impurities and P-type impurities are implanted into the P-type well by, for example but not limited to, ion implantation process (IMP).

It is to be understood that even though numerous characteristics and advantages of the present embodiments have been set forth in the foregoing description, with details of the structures and functions of the embodiments, the disclosure is illustrative only; and changes may be in detail, especially in the matter of arrangement of parts within the principles of the embodiments to the full extent indicated by the broad general meaning of the terms in which the appended claims are expressed.

What is claimed is:

1. An electrostatic discharge (ESD) protection device comprising:
    two N-metal oxide semiconductor (NMOS) elements arranged on a P-substrate, the P-substrate comprising an N-type well, wherein each NMOS element comprises:
        a gate, the gate having a first side and a second side, the second side position opposite to and away from the first side;
        a source arranged on the first side of the gate; and
        a drain arranged on the second side of the gate;
    a doped region formed on a periphery of the two NMOS elements; and
    a PN junction formed between the doped region and the P-substrate;
    wherein the drains of the two NMOS elements and the doped region are formed in the same N-type well of the P-substrate; the N-type well comprises a P-type well; the sources of both of the two NMOS elements are formed in the P-type well; the doped region separates from the P-type well; the doped region surrounds the four sides of the two NMOS elements, and has a heavier N-type impurity concentration than the N-type well.

2. The ESD protection device of claim 1, wherein a P+ doping region and a first N+ doping region connected to the P+ doping region are arranged on one side of the gate, and a second N+ doping region is arranged on other side of the gate.

3. The ESD protection device of claim 2, wherein the first N+ doping region serves as the source and the second N+ doping region serves as the drain.

4. The ESD protection device of claim 3, wherein the P+ doping region and the first N+ doping region are arranged in a P-type well and the P-type well which is arranged in an N-type well of the P-substrate.

5. The ESD protection device of claim 4, wherein the doped region is formed surrounding the P-type well.

6. The ESD protection device of claim 3, wherein the doped region is implanted to the N-type well by an ion implantation process using energy of 80-150 KeV.

7. The ESD protection device of claim 4, wherein the doped region comprises highly N-type impurities and the doped region has heavier N-type impurity concentration than the N-type well.

8. The ESD protection device of claim 7, wherein a density of the N-type impurities of the doped region is larger than 8.5E12 atom/cm$^2$.

9. The ESD protection device of claim 7, wherein the N-type impurities comprise at least one of phosphor, arsenic, and antimony.

10. The manufacturing method of ESD protection device of claim 9, wherein one part of the gate covers an isolation layer and the other part of the gate covers a high voltage gate oxide layer.

11. The manufacturing method of ESD protection device of claim 9, wherein a P+ doping region and a first N+ doping region connected to the P+ doping region are arranged on one side of the gate, and a second N+ doping region is arranged on other side of the gate.

12. The manufacturing method of ESD protection device of claim 11, wherein the first N+ doping region servers as the source and the second N+ doping region servers as the drain.

13. The manufacturing method of ESD protection device of claim 12, wherein the P+ doping region and the first N+ doping region are arranged in a P-type well and the P-type well which is arranged in an N-type well of the P-substrate.

14. The manufacturing method of ESD protection device of claim 13, wherein the doped region is formed around the P-type well.

15. The manufacturing method of ESD protection device of claim 12, wherein the doped region is implanted to the N-type well by an ion implantation process, and energy of the ion implantation process using energy of 80-150 KeV.

16. The manufacturing method of ESD protection device of claim 12, wherein the doped region comprises highly N-type impurities and the doped region has heavier N-type impurity concentration than the N-type well.

17. The manufacturing method of ESD protection device of claim 16, wherein a density of the N-type impurities of the doped region is larger than 8.5E12 atom/cm$^2$.

18. The manufacturing method of ESD protection device of claim 16, wherein the N-type impurities comprises at least one of phosphor, arsenic, and antimony.

19. A manufacturing method of an electrostatic discharge (ESD) protection device, comprising:
    providing a P-substrate and forming an N-type well in the P-substrate;
    forming a P-type well in the N-type well to define a region of two N-metal oxide semiconductor (NMOS) elements;
    forming an isolation layer along an edge of the N-type well;
    forming a doped region by implanting highly N-type impurities into outer space of the P-type well;
    forming a gate on the isolation layer; and
    forming a P+ doping region, a first N+ doping region, and a second N+ doping region by implanting N-type impurities and P-type impurities into the P-type well with the isolation layer as a mask;
    wherein drains of the two NMOS elements and the doped region are formed in the same N-type well of the P-substrate; the N-type well comprises a P-type well; sources of both of the two NMOS elements are formed in the P-type well; the doped region separates from the P-type well; the doped region surrounds the four sides of the two NMOS elements, and has a heavier N-type impurity concentration than the N-type well.

* * * * *